United States Patent [19]
Mattisson et al.

[11] Patent Number: 6,104,238
[45] Date of Patent: Aug. 15, 2000

[54] FM DEMODULATOR INCLUDING TUNING OF A FILTER AND DETECTOR

[75] Inventors: Sven Mattisson, Bjärred, Sweden; Jacobus Haartsen, Borne, Netherlands

[73] Assignee: Telefonaktiebolaget LM Ericsson, Stockholm, Sweden

[21] Appl. No.: 09/274,331

[22] Filed: Mar. 23, 1999

[30] Foreign Application Priority Data

Mar. 24, 1998 [GB] United Kingdom .................... 9806205

[51] Int. Cl.[7] ............................... H03D 3/00; H04L 27/14
[52] U.S. Cl. ............................ 329/319; 329/325; 455/214
[58] Field of Search ..................................... 329/315, 318, 329/319, 320, 325, 326, 344; 455/214; 375/324

[56] References Cited

U.S. PATENT DOCUMENTS

| | | | |
|---|---|---|---|
| 4,336,613 | 6/1982 | Hewes | 375/9 |
| 5,053,717 | 10/1991 | Schulz et al. | 329/300 |
| 5,175,749 | 12/1992 | Ficht et al. | 375/76 |
| 5,663,989 | 9/1997 | Fobbester | 375/344 |

FOREIGN PATENT DOCUMENTS

| | | |
|---|---|---|
| 2214742A | 9/1989 | United Kingdom . |
| 2283871A | 5/1995 | United Kingdom . |
| WO8602505 | 4/1986 | WIPO . |
| WO8705170 | 8/1987 | WIPO . |

*Primary Examiner*—Siegfried H. Grimm
*Attorney, Agent, or Firm*—Burns, Doane, Swecker & Mathis, L.L.P.

[57] ABSTRACT

An FM demodulator circuit includes a filter (10) and a detector (14) for receiving a frequency modulated input signal and for providing a demodulated output signal. A tuning circuit (19) is provided for tuning the frequency characteristics of the filter and of the detector. A DC offset estimator (18) is connected to the output of the detector to produce an offset signal representing the estimated DC offset of the demodulated output signal, and to provide the offset signal to the tuning circuit. The tuning circuit is operable to tune the frequency characteristics of the filter and detector in dependence upon the offset signal.

8 Claims, 1 Drawing Sheet

FM DEMODULATOR INCLUDING TUNING OF A FILTER AND DETECTOR

This application claims priority under 35 U.S.C §§119 and/or 365 to 9806205.2 filed in United Kingdom on Mar. 24, 1998; the entire content of which is hereby incorporated by reference.

The present invention relates to demodulator circuits for demodulating frequency modulated (FM) signals.

DESCRIPTION OF THE RELATED ART

Referring to FIG. 1 of the accompanying drawings, a frequency modulated radio frequency (RF) signal is conventionally received by a receiver 1 from an antenna 2, and processed by the receiver 1 to produce an FM signal at an intermediate frequency which is lower than the RF carrier frequency. The IF modulated signal is then filtered by an IF band pass filter 4 and amplitude limited to a constant amplitude by a hard limiter 5. The constant amplitude signal is then fed to a detector 6 for demodulation by multiplying the signal by its time derivative. This operation makes the product amplitude proportional to both the signal's amplitude and angular frequency (intermediate frequency IF plus FM frequency deviation). Since the FM IF signal has a constant amplitude, due to the hard limiter 5, the product signal has an amplitude proportional to the frequency deviation and the modulation signal can easily be recovered after a low-pass filter removes the signal components at multiples of the IF frequency.

Prior to detection, the FM signal has to be filtered by means of an IF filter such that adjacent channels and other out-of-channel interference is suppressed.

IF filters and FM-detectors in use today often employ passive resonator components that are trimmed, either at production or by exploiting signal properties. When the resonators are pre-tuned, they are tuned to the nominal IF frequency. FM detectors often exploit signal properties (e.g. zero mean of the detected signal) to automatically compensate for detuning. This detuning may be due to resonators being off their nominal value or the received IF signal being offset in frequency. The latter may be due to a combination of frequency offsets in the local and remote reference oscillators.

Adjusting the IF strip (IF filter and FM detector) to the nominal IF frequency does not guarantee a DC free baseband signal, even if the baseband signal nominally has a zero mean. Skewing the detector, of a properly tuned IF strip, to minimize its DC offset will compensate for local and remote reference frequency differences. This will improve sensitivity somewhat but if the linear region of the detector is not very wide, signal-dependent offsets will occur and the detector may in fact be desensitized. The detector output amplitude is smallest for alternating ones and zeroes and much larger for contiguous blocks of ones or zeroes because of inter-symbol interference in digital radios. When the detector Q is high, such blocks of ones or zeroes may cause the detector to compress the signal. This compression will be asymmetric if the detector resonator or threshold is detuned to compensate DC offsets in other blocks resulting in a signal dependent offset. Similarly, in analog radios signal distortion will increase when the detector is used to compensate for frequency offsets.

An FM detector with a very wide linear range will inevitably have low sensitivity and result in very small and noisy output signals. Thus, the detector sensitivity will be a compromise between signal distortion and noise.

SUMMARY OF THE PRESENT INVENTION

According to one aspect of the present invention, there is provided a demodulator circuit for demodulating a frequency modulated input signal, the circuit comprising:

filter means and detector means for receiving a frequency modulated input signal and for providing a demodulated output signal;

tuning means for tuning the frequency characteristics of the filter means and of the detector means; and DC offset estimator means which are operable to estimate the DC offset of the demodulated output signal, and to produce an offset signal representing the estimated DC offset, and to provide the offset signal to the tuning means, the tuning means being operable to tune the frequency characteristics of the filter means and detector means in dependence upon the offset signal.

According to a second aspect of the present invention, there is provided a method of tuning a demodulator circuit including filter means and detector means, the method comprising:

estimating a DC offset level of a demodulated signal output by the detector means;

producing an offset signal on the basis of the estimated DC offset level;

adjusting the frequency characteristics of the filter means and detector means in dependence upon the value of the offset signal.

DETAILED DESCRIPTION OF THE PREFERRED EMBODIMENT

Figure 1:
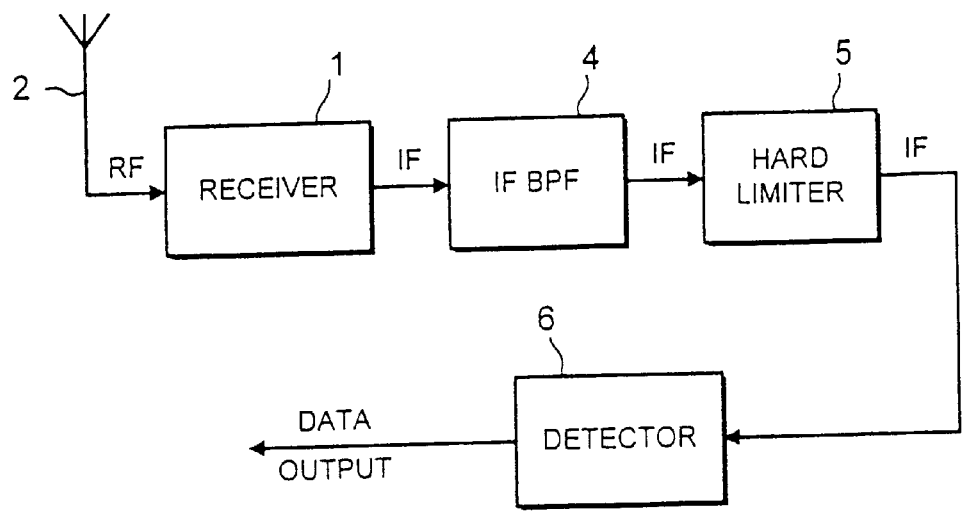
FIG. 1 shows a block diagram of a FM signal receiving and demodulating circuit.
Figure 2:
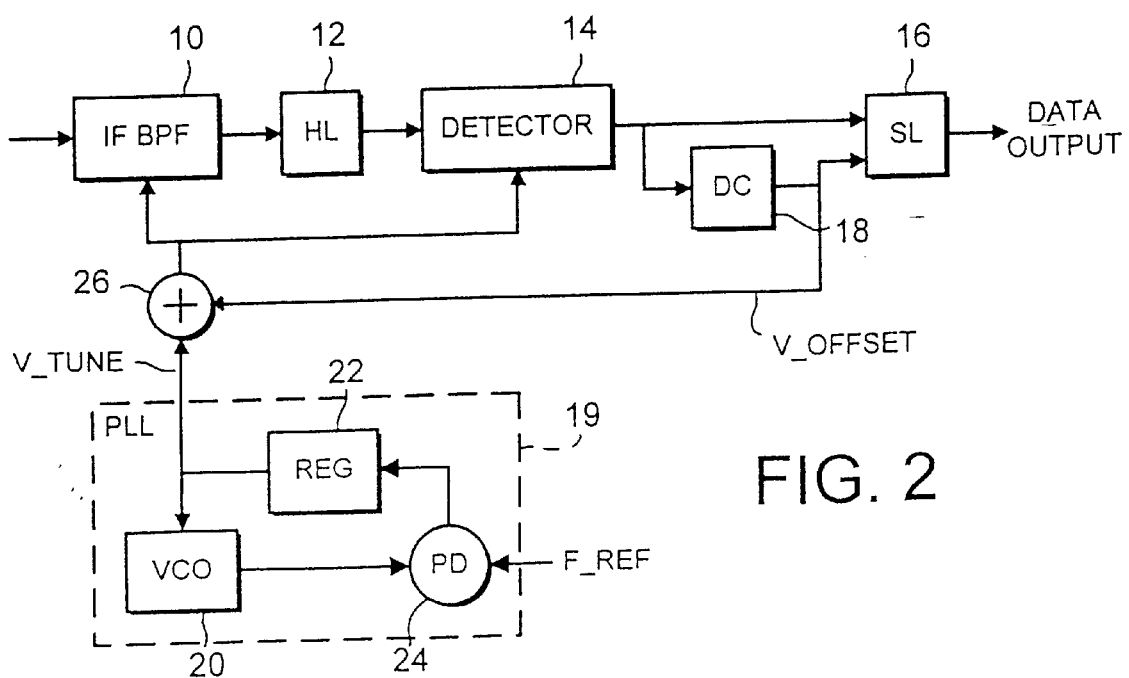
FIG. 2 shows a block diagram of a demodulator circuit embodying the present invention.

A demodulator circuit embodying the invention is shown in FIG. 2 and comprises an intermediate frequency bandpass filter 10 (IF BPF) which receives and filters an incoming FM intermediate frequency signal V_IF, in order to remove unwanted noise and harmonic signals. The output of the intermediate filter 10 is connected to the input of a hard limiter 12 (HL) which produces a constant amplitude output signal. This constant amplitude signal is fed to a FM detector 14 which operates broadly in line with the detector described with reference to FIG. 1. The output of the detector 14 is supplied to a data slicer 16 (SL) and to a DC offset estimator 18 (DC).

The data slicer 16 converts the demodulated FM signal to a synchronous binary signal based on the difference between the detector output and the estimated DC offset signal produced by the DC offset estimator.

The DC estimator is a known circuit and typically provided by a low-pass filter, in combination with a sample-and-hold circuit and synchronisation circuitry to keep the samples in line with the demodulaotr timing. Typically, a DC-free data packet is received, usually as a preamble to the data, and then low-pass filtered to give an estimate of the DC offset of the packet.

Tuning of the demodulator circuit is achieved in two stages. Firtly by coarsely tuning the IF strip to the nominal intermediate frequency, and then any DC offset is compensated for.

Nominal tuning of the IF strip (IF BPF and detector) is achieved using a phase locked loop (PLL) circuit 19, which includes a voltage controlled oscillator 20 (VCO), a regulator 22, and a phase detector 24. The PLL circuit 19 operates in conventional manner to produce a output signal V_tune which is dependent upon the phase relationship between the output of the VCO 20 and a reference frequency f_ref. The VCO 20 uses circuitry similar to that used in the filter and detector to enable process variations to be followed. The PLL output voltage V_tune will then reflect process spread (e.g. fast, slow or nominal).

The IF strip can therefore be tuned to the nominal intermediate frequency by setting the PLL reference f_ref to have a known relationship to the intermediate frequency. For example, f_ref may be equal to the intermediate frequency, or may be a multiple of the frequency Since an offset in the receiver (FIG. 1) local oscillator, and/or in the transmitter oscillator, will cause the effective intermediate frequency to be offset from the nominal value (controlled by V_tune) a readjustment of the IF strip to the intermediate frequency used by the IF BPF and the detector will therefore improve performance of the demodulator circuit.

The difference between nominal and effective center frequency is estimated by the DC estimator (DC), which produces an output signal representative of this difference. This signal is used by the data slicer as a threshold to determine which data bits are above or below the actual DC level of the output signal.

In order to tune the IF BPF and the detector to the effective intermediate frequency, the DC estimator output signal V_offset, is added to the PLL output V_tune by an adder circuit. The differences in V_tune and V_offset mean that the V_offset signal must be translated so that the addition of the two signals produces the desired result. this can be achieved by feedback or by tuning the gain of the DC estimator in advance.

Thus, the intermediate frequency at which the demodulator operates can be fine tuned to compensate for the frequency offset.

Only a fraction of the channel band width is fine tuned; no more than that required to compensate for crystal oscillator offsets (and some additional circuit offsets that are smaller than the offsets caused by crystal spread).

If the IF strip is tuned to the nominal IF (e.g. pre-tuned or automatically tuned) and the signal properties are known, at least for parts of the signal (e.g. the preamble) the IF and detector resonators may be offset to minimize the deviation of the detected signal value from the known result. For example, if the preamble has a zero mean the detector output using the preamble may be used to fine tune the IF resonators to the IF frequency actually received (nominal frequency plus TX and RX reference errors).

By moving the entire IF strip to the actual IF frequency, rather than zero the detector output only, better detector symmetry is preserved and sensitivity is improved. Adjacent channel suppression will also improve as the IF filter is centred at the actual received channel frequency.

The detector offset compensation (less its resonator tuning) will not vary for small changes in IF frequency and this does not require any compensation.

A possible implementation is to have gyrator-based IF filter and FM detector resonators. The resonators are tuned by varying their gyration constant. A master oscillator built from a similar gyrator resonator may be used as a VCO in a PLL. When the master gyration constant is changed, the VCO frequency changes and the PLL may be locked to a reference frequency (equal to the IF or suitable scaled). The master gyrator tuning voltage is then copied to the IF resonators and they will assume the same tuning as the master, less mismatches. These mismatches are much smaller than absolute variations and may be neglected in a well designed circuit. The FM detector output is adjusted to provide zero offset at the nominal tuning.

By adding an offset to the tuning voltage copies from the master gyrator it is possible to detune the IF-strip from the nominal IF frequency in a controlled fashion. This offset may, for example, be derived from a detected mean value of preamble data of a data stream in such a way that the resulting offset is zeroed.

The proposed scheme offers an FM detector offset compensation method that is compatible with integration and automatic tuning. the IF-strip resonators and FM detector phase characteristic may be adjusted independently of the building-block offset compensation resulting in an IF strip centred on the received IF frequency.

In presence of TX and RX reference frequency offsets the IF strip will be re-centred to the actual if frequency, thus maximising detector symmetry, adjacent channel suppression and receiver sensitivity.

What is claimed is:

1. A demodulator circuit for demodulating a frequency modulated input signal, the circuit comprising:

filter means and detector means for receiving a frequency modulated input signal and for providing a demodulated output signal;

tuning means for tuning the frequency characteristics of the filter means and of the detector means; and DC offset estimator means which are operable to estimate the DC offset of the demodulated output signal, and to produce an offset signal representing the estimated DC offset, and to provide the offset signal to the tuning means, the tuning means being operable to tune the frequency characteristics of the filter means and detector means in dependence upon the offset signal.

2. A circuit as claimed in claim 1, wherein the tuning means are operable to supply a tuning signal to the filter means and to the detector means, the tuning signal being based upon the offset signal and a reference signal.

3. A circuit as claimed in claim 2, wherein the reference signal is provided by a phase locked loop circuit, and the tuning signal is equivalent to the sum of the reference signal and an appropriately scaled copy of the offset signal.

4. A circuit as claimed in claim 3, wherein the phase locked loop circuit has an input reference frequency substantially proportional to the nominal frequency of the input signal.

5. A method of tuning a demodulator circuit including filter means and detector means, the method comprising:

estimating a DC offset level of a demodulated signal output by the detector means;

producing an offset signal on the basis of the estimated DC offset level;

adjusting the frequency characteristics of the filter means and detector means in dependence upon the value of the offset signal.

6. A method as claimed in claim 5, wherein the offset signal is combined with a reference signal and the frequency characteristics of the filter means and the detector means are adjusted on the basis of the combined signal.

7. A method as claimed in claim 6, wherein the reference signal is produced by a phase locked loop circuit tuned to a reference frequency.

8. A method as claimed in claim 7, wherein the reference frequency is substantially proportional to the nominal frequency of a frequency modulated signal input to the filter means.

\* \* \* \* \*